(12) United States Patent
Kitagawa et al.

(10) Patent No.: US 10,504,739 B2
(45) Date of Patent: Dec. 10, 2019

(54) CURABLE COMPOSITION FOR OPTICAL IMPRINTING AND PATTERN FORMING METHOD

(71) Applicant: FUJIFILM Corporation, Tokyo (JP)

(72) Inventors: Hirotaka Kitagawa, Haibara-gun (JP); Yuichiro Goto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 651 days.

(21) Appl. No.: 15/083,352

(22) Filed: Mar. 29, 2016

(65) Prior Publication Data

US 2016/0211143 A1    Jul. 21, 2016

Related U.S. Application Data

(63) Continuation of application No. PCT/JP2014/075046, filed on Sep. 22, 2014.

(30) Foreign Application Priority Data

Sep. 30, 2013 (JP) ................. 2013-203878

(51) Int. Cl.

| | |
|---|---|
| *H01L 21/308* | (2006.01) |
| *C09D 4/06* | (2006.01) |
| *C09D 11/101* | (2014.01) |
| *C09D 11/30* | (2014.01) |
| *G03F 7/00* | (2006.01) |
| *H01L 21/02* | (2006.01) |
| *G03F 7/027* | (2006.01) |
| *G03F 7/038* | (2006.01) |

(52) U.S. Cl.
CPC ............ *H01L 21/3081* (2013.01); *C09D 4/06* (2013.01); *C09D 11/101* (2013.01); *C09D 11/30* (2013.01); *G03F 7/0002* (2013.01); *G03F 7/027* (2013.01); *G03F 7/038* (2013.01); *G03F 7/0388* (2013.01); *H01L 21/02118* (2013.01); *H01L 21/02288* (2013.01); *H01L 21/02345* (2013.01); *H01L 21/3086* (2013.01); *Y10T 428/24802* (2015.01)

(58) Field of Classification Search
CPC ......... H01L 21/3081; Y10T 428/24802; G03F 7/0002
See application file for complete search history.

(56) References Cited

U.S. PATENT DOCUMENTS

| | | | | |
|---|---|---|---|---|
| 7,175,949 | B1 * | 2/2007 | Tao | ............ G03F 7/029 430/17 |
| 8,859,071 | B2 | 10/2014 | Kodama | |
| 2010/0047457 | A1 * | 2/2010 | Bentley | .............. C09D 11/101 427/280 |
| 2011/0059302 | A1 | 3/2011 | Kodama | |
| 2014/0154471 | A1 | 6/2014 | Kodama et al. | |

FOREIGN PATENT DOCUMENTS

| | | | | |
|---|---|---|---|---|
| EP | 1182033 A1 * | 2/2002 | ........... | B41C 1/1008 |
| JP | 2008-502157 A | 1/2008 | | |
| JP | 2010-239121 A | 10/2010 | | |
| JP | 2012134446 A * | 7/2012 | | |
| JP | 2012-159651 A | 8/2012 | | |
| JP | 2013-36027 A | 2/2013 | | |
| KR | 10-2012-0059346 A | 6/2012 | | |
| WO | 2005/000552 A2 | 1/2005 | | |
| WO | 2005/120834 A2 | 12/2005 | | |

OTHER PUBLICATIONS

Machine translation of detailed description of JP 2012-159651 acquired on Sep. 20, 2018.*
International Preliminary Report on Patentability issued from the International Bureau in counterpart International Application No. PCT/JP2014/075046, dated Apr. 14, 2016.
Stephen Y. Chou et al., "Imprint of sub-25 nm vias and trenches in polymers", Appl. Phys. Lett., Nov. 20, 1995, pp. 3114-3116, vol. 67, No. 21.
M. Colburn et al., "Step and Flash Imprint Lithography: A New Approach to High-Resolution Patterning", SPIE, Mar. 1999, pp. 379-389, vol. 3676.
M. Bender et al., "Multiple imprinting in UV-based nanoimprint lithography: related materials issues", Microelectronic Engineering, 2002, pp. 407-413, vol. 61-62.
International Search Report for PCT/JP2014/075046 dated Dec. 16, 2014.
Written Opinion for PCT/JP2014/075046 dated Dec. 16, 2014.
Office Action dated Mar. 14, 2017, from the Korean Intellectual Property Office in counterpart Korean Application No. 10-2016-7008125.

(Continued)

*Primary Examiner* — Gerard Higgins
(74) *Attorney, Agent, or Firm* — Sughrue Mion, PLLC

(57) ABSTRACT

A curable composition for optical imprinting which is excellent in ink jet adequacy and releasability, a pattern forming method, a fine pattern, and a method for manufacturing a semiconductor device are provided. The curable composition for optical imprinting contains a polymerizable compound (A), a photopolymerization initiator (B), and a compound (C) expressed by General Formula (I); in General Formula (I), A represents a dihydric to hexahydric polyhydric alcohol residue. p represents 0 to 2, 1 q represents 1 to 6, p+q represents an integer of 2 to 6, each of m and n independently represents 0 to 20. r expressed by Formula (1) is 6 to 20. Each R independently represents an alkyl group having 1 to 10 carbon atoms, an aryl group, or an acyl group.

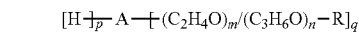

$$[H\!-\!\!\!\overset{}{\underset{p}{|}}\!\!A\!-\!\!\!\overset{}{\underset{}{|}}\!(C_2H_4O)_m/(C_3H_6O)_n\!-\!R]_q \quad (1)$$

r = (sum of m) + (sum of n)

17 Claims, No Drawings

(56) References Cited

OTHER PUBLICATIONS

Office Action dated Jun. 21, 2016, from the Japanese Patent Office in counterpart Japanese Application No. 2013-203878.
Office Action dated Dec. 13, 2017, issued by the Intellectual Property Office Ministry of Economic Affairs of Taiwan in counterpart Taiwanese Application No. 103133403.

* cited by examiner

CURABLE COMPOSITION FOR OPTICAL IMPRINTING AND PATTERN FORMING METHOD

CROSS-REFERENCE TO RELATED APPLICATIONS

This application is a Continuation of PCT International Application No. PCT/JP2014/075046 filed on Sep. 22, 2014, which claims priority under 35 U.S.C § 119(a) to Japanese Patent Application No. 2013-203878 filed on Sep. 30, 2013. Each of the above application(s) is hereby expressly incorporated by reference, in its entirety, into the present application.

BACKGROUND OF THE INVENTION

1. Field of the Invention

The invention relates to a curable composition for optical imprinting, a pattern forming method, a fine pattern, and a method for manufacturing a semiconductor device. Specifically, the invention relates to a curable composition for optical imprinting for forming a fine pattern using photoirradiation used for manufacturing a semiconductor integrated circuit, a flat screen, a micro-electromechanical systems (MEMS), a sensor element, an optical disk, a magnetic recording medium such as a high density memory disk, an optical component such as a diffraction grating or a relief hologram, a nano device, an optical device, an optical film or a polarizing element for manufacturing a flat panel display, a thin film transistor of a liquid crystal display, an organic transistor, a color filter, an overcoat layer, a column member, a rib material for liquid crystal orientation, a microlens array, an immunological analyzing chip, a DNA separation chip, a microreactor, a nano-bio device, an optical waveguide, an optical filter, and a photonic liquid crystal.

2. Description of the Related Art

The imprinting method is a technique of precisely transferring a fine pattern by pressing a mold standard (generally referred to as a mold, a stamper, or a template), which is obtained by forming an uneven pattern by developing an embossing technology well-known in an optical disc production, to a resist and dynamically deforming the mold standard. If the mold is once manufactured, a fine structure such as a nanostructure can be repeatedly molded in a simple way. Therefore, the mold is economical and, recently, an application thereof in various fields is expected.

As an imprinting method, a heat imprinting method (for example, see S. Chou et al., Appl. Phys. Lett. 67, 3114 (1995)) using a thermoplastic resin as a workpiece and an optical imprinting method (for example, see M. Colbun et al., Proc. SPIE 3676, 379 (1999)) using a curable composition are suggested. The heat imprinting method is a method of pressing a mold to a polymer resin heated to the glass transition temperature or higher, cooling the mold to a glass transition temperature or less, and releasing the mold, such that a fine structure is transferred to the resin on the substrate. This method is extremely simple and can be applied to various resin materials or various glass materials.

Meanwhile, the optical imprinting method is a method of performing photoirradiation through a light transmitting mold or a light transmitting substrate, photocuring a curable composition, and separating the mold such that a fine pattern is transferred to a photocured product. This method makes imprinting possible in room temperature, and thus this method can be applied to a precision processing field of an ultrafine pattern for manufacturing a semiconductor integrated circuit or the like. Recently, new developments such as a nano-scanning method in which advantages of the both are combined or a reversal imprinting method for manufacturing a three-dimensional laminate structure are reported.

In this imprinting method, applications as below are suggested.

A first application is that a molded shape (pattern) itself has a function, and is used as an element component or a structural member of nanotechnologies. Examples thereof include structural members of various types of a micro- or nano-optical element, a high-density recording medium, an optical film, or a flat panel display.

A second application is to construct a laminate structure by integral molding of a micro structure and a nano structure or by simple interlayer position alignment and use this laminate structure for manufacturing a micro-total analysis system (μ-TAS) or a biochip.

A third application is to cause a formed pattern to be a mask and use the pattern for processing a substrate in a method such as etching. In this technique, owing to high precision position alignment and high integration, the formed pattern can be used for manufacturing high precision semiconductor integrated circuit, manufacturing a transistor of a liquid crystal display, and processing a magnetic body of a next generation hard disk called a patterned medium, instead of the lithography technique in the related art. Approaches to a practical use of the imprinting method relating to these applications are recently active.

The imprinting method has a step of separating a mold and thus releasability thereof becomes a problem in the related art. As a method of improving releasability, a method of performing a releasing treatment on a mold surface with a releasing agent such as a silane coupling agent having a perfluoro group is well-known in the art. This method decreases a surface energy on the mold surface, and thus an effect in improving releasability is excellent. However, as the imprinting is repeated, the releasing agent is deteriorated, and thus there is a problem in durability.

As an attempt for improving durability of a releasing treatment, a method of causing a silane coupling agent having a perfluoro group to be contained in the curable composition is well-known (M. Bender et al., Microelectronic Engineering 61-62, 407 (2002)). This method has a problem in that preservation stability of the curable composition is bad and defects of the imprinting pattern increase, since the silane coupling agent has reactivity in this method.

In addition, as an attempt for improving releasability, a method of causing a surfactant having a perfluoro group to be contained in a curable composition (WO2005/000552A), a method of causing a polymerizable compound having an alkyl group including two or more fluorine atoms to be contained in a curable composition (JP2010-239121A), and a method of causing a non-polymerizable compound having a polyalkylene glycol structure to be contained in the curable composition (JP2013-036027A) are well-known. In this method, the preservation stability of the curable composition which becomes a problem as the silane coupling agent can be secured.

Meanwhile, in the use of causing the ultrafine pattern to be formed with high precision in the imprinting method (for example, a use as an etching resist for processing a semiconductor substrate), an ink jet method attracts attention (JP2008-502157A). In the ink jet method, an amount of the curable composition is adjusted in response to the density of the pattern, and thus thickness unevenness of the residual film can be reduced. In addition, there is an advantage in that utilization efficiency of a material is higher than that in a spin coating method. However, if ink jet ejection is not precisely and efficiently performed, a problem of filling failure of the curable composition or film unevenness of the residual film is generated.

SUMMARY OF THE INVENTION

Here, the present inventors have diligently conducted examinations with respect to the related art and have found out that a method of causing a surfactant having a perfluoro group to be contained in a curable composition or a method of causing a polymerizable compound having an alkyl group containing two or more fluorine atoms to be contained in the curable composition drastically reduces surface tension of the curable composition, and thus the ink jet ejection properties are deteriorated. Meanwhile, the present inventors have found that a method of causing a non-polymerizable compound having a polyalkylene glycol structure to be contained in a curable composition maintains surface tension of the curable composition but the viscosity is high, and thus ink jet ejection properties are deteriorated.

An object of the invention is to solve the problems described above and to provide a curable composition for optical imprinting which is excellent in ink jet adequacy and releasability. In addition, an object of the invention is to provide a pattern forming method using the curable composition for optical imprinting and a pattern that can be obtained in the pattern forming method. Further, the invention relates to a method for manufacturing a semiconductor device in which the pattern is used as an etching mask.

Based on this circumstance, the present inventors have diligently conducted examinations and, as a result, have found that if a compound having a specific polyalkylene glycol structure is caused to be contained in the curable composition for optical imprinting, ink jet adequacy and releasability of the curable composition for optical imprinting are improved, so as to complete the invention.

Specifically, by the means of <1> below, and preferably by <2> to <16>, the problems are solved.

<1> A curable composition for optical imprinting, including: a polymerizable compound (A); a photopolymerization initiator (B); and a compound (C) expressed by General Formula (I),

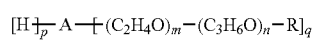

General Formula (I)

in which, in General Formula (I), A represents a dihydric to hexahydric polyhydric alcohol residue, p represents 0 to 2, q represents 1 to 6, p+q represents an integer of 2 to 6, each of m and n independently represents 0 to 20, r expressed by Formula (1) is 6 to 20, and each R independently represents an alkyl group having 1 to 10 carbon atoms, an aryl group, or an acyl group.

$r = (\text{sum of } m) + (\text{sum of } n)$         (1)

<2> The curable composition for optical imprinting according to <1>, in which a content of the compound (C) expressed by General Formula (I) is 3 mass % to 15 mass % with respect to a total composition except for a solvent.

<3> The curable composition for optical imprinting according to <1> or <2>, in which a viscosity of the curable composition for optical imprinting at 23° C. is 15 mPa·s or less, and surface tension thereof is 25 mN/m to 35 mN/m.

<4> The curable composition for optical imprinting according to any one of <1> to <3>, in which, in General Formula (I), A is a trihydric to hexahydric polyhydric alcohol residue.

<5> The curable composition for optical imprinting according to any one of <1> to <4>, in which, in General Formula (I), R is an alkyl group having 1 to 4 carbon atoms.

<6> The curable composition for optical imprinting according to any one of <1> to <5>, in which, in General Formula (I), p is 0.

<7> The curable composition for optical imprinting according to any one of <1> to <6>, in which, in General Formula (I), m is 0.

<8> The curable composition for optical imprinting according to any one of <1> to <7>, in which the polyhydric alcohol residue has 2 to 10 carbon atoms.

<9> The curable composition for optical imprinting according to any one of <1> to <6> or <8>, in which, in General Formula (I), n is 0.

<10> The curable composition for optical imprinting according to any one of <1> to <9>, in which the polymerizable compound (A) is a (meth)acrylate compound.

<11> The curable composition for optical imprinting according to any one of <1> to <10>, in which the polymerizable compound (A) is a compound having an aromatic group.

<12> The curable composition for optical imprinting according to any one of <1> to <11>, in which the curable composition for optical imprinting does not substantially contains a solvent.

<13> A pattern forming method, including: applying the curable composition for optical imprinting according to any one of <1> to <12> on a base material or a mold having a fine pattern; and performing photoirradiation in a state in which the curable composition for optical imprinting is interposed between the mold and the base material.

<14> The pattern forming method according to <13>, in which the method of applying the curable composition for optical imprinting on the base material or the mold having the fine pattern is an ink jet method.

<15> A fine pattern obtained by the pattern forming method according to <13> or <14>.

<16> A method for manufacturing a semiconductor device using the pattern according to <15> as an etching mask.

According to the invention, it is possible to provide a curable composition for optical imprinting which is excellent in ink jet adequacy and releasability. In addition, it is possible to provide a pattern forming method using the curable composition for optical imprinting, a pattern that can be obtained in the pattern forming method, and a method for manufacturing a semiconductor device by using the pattern as an etching mask.

DESCRIPTION OF THE PREFERRED EMBODIMENTS

Hereinafter, details of the invention are specifically described. Components described below are described based on representative embodiments of the invention, but the invention is not limited thereto. The expression "to" in this specification is used as a meaning, in which numerical values before and after the expression are used as minimum and maximum values.

In this specification, "(meth)acrylate" represents acrylate and methacrylate, "(meth)acryl" represents acryl and methacryl, and "(meth)acryloyl" represents acryloyl and methacryloyl. In addition, in this specification, a "monomeric substance" and a "monomer" have the same meaning. The monomeric substance in this specification refers to a compound which is different from an oligomer and a polymer and has a weight average molecular weight of less than 1,000. In this specification, a "functional group" refers to a group relating to polymerization reaction. In addition, the expression "imprinting" in the invention preferably refers to pattern transferring in a size of 1 nm to 100 μm, and more preferably refers to pattern transferring in a size of 10 nm to 1 μm (nanoimprinting).

In the denotation of a group (atomic group) in this specification, the denotation without substitution or unsubstitution includes a group not having a substituent together with a group having a substituent. For example, an "alkyl group" refers to not only an alkyl group (unsubstituted alkyl group) not having a substituent but also an alkyl group (substituted alkyl group) having a substituent.

[Curable Composition for Optical Imprinting]

The curable composition for optical imprinting according to the invention (hereinafter, also simply referred to as a "composition according to the invention") contains a polymerizable compound (A), a photopolymerization initiator (B), and a compound (C) expressed by General Formula (I).

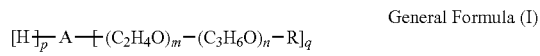

General Formula (I)

(In General Formula (I), A represents a dihydric to hexahydric polyhydric alcohol residue. p represents 0 to 2, q represents 1 to 6, p+q represents an integer of 2 to 6, and each of m and n independently represents 0 to 20. r expressed by Formula (1) below is 6 to 20. Each R independently represents an alkyl group having 1 to 10 carbon atoms, an aryl group, or an acyl group.)

$$r=(\text{sum of } m)+(\text{sum of } n) \quad (1)$$

Hereinafter, details thereof are described.

Polymerizable Compound (A)

The polymerizable compound used in the composition according to the invention is not particularly limited, as long as the polymerizable compound does not depart from the gist of the invention. Examples thereof include a polymerizable unsaturated monomeric substance having 1 to 6 groups containing ethylenically unsaturated bonds; an epoxy compound, an oxetane compound; a vinyl ether compound; a styrene derivative; propenyl ether; and butenyl ether. Specific examples of the polymerizable compound (A) include compounds disclosed in paragraphs "0020" to "0098" of JP2011-231308A, and contents thereof are incorporated in this specification. These compounds may be used singly or two or more types thereof may be mixed to be used.

A polymerizable unsaturated monomeric substance having 1 to 6 ethylenically unsaturated bond containing groups (polymerizable unsaturated monomeric substance having functionality of 1 to 6) is described.

Examples of the polymerizable unsaturated monomeric substance having one group containing an ethylenically unsaturated bond preferably used in the invention include methyl (meth)acrylate, ethyl (meth)acrylate, butyl (meth)acrylate, isobutyl (meth)acrylate, t-butyl (meth)acrylate, octyl (meth)acrylate, isooctyl (meth)acrylate, 2-ethylhexyl (meth)acrylate, lauryl (meth)acrylate, tridecyl (meth)acrylate, isomyristyl (meth)acrylate, cetyl (meth)acrylate, stearyl (meth)acrylate, cyclohexyl (meth)acrylate, isobornyl (meth)acrylate, dicyclopentanyl (meth)acrylate, dicyclopentenyl (meth)acrylate, dicyclopentanyloxyethyl (meth)acrylate, dicyclopentenyloxyethyl (meth)acrylate, adamantyl (meth)acrylate, methoxy ethyl (meth)acrylate, ethoxy ethyl (meth)acrylate, butoxy ethyl (meth)acrylate, ethylcarbitol (meth)acrylate, 2-ethylhexylcarbitol (meth)acrylate, methoxy triethylene glycol (meth)acrylate, methoxy polyethylene glycol (meth)acrylate, methoxy dipropylene glycol (meth)acrylate, methoxy tripropylene glycol (meth)acrylate, glycidyl (meth)acrylate, 3-methyl-3-oxetanyl (meth)acrylate, tetrahydrofurfuryl (meth)acrylate, 2,2-dimethyl-4-(meth)acryloyloxymethyldioxolane, 2-ethyl-2-methyl-4-(meth)acryloyloxymethyldioxolane, 2-isobutyl-2-methyl-4-(meth)acryloyloxymethyldioxolane, 2-cyclohexyl-2-methyl-4-(meth)acryloyloxymethyldioxolane, α-(meth)acryloyloxy-γ-butyrolactone, β-(meth)acryloyloxy-γ-butyrolactone, 2-hydroxyethyl (meth)acrylate, 2-hydroxypropyl (meth)acrylate, 2-hydroxybutyl (meth)acrylate, 4-hydroxybutyl (meth)acrylate, dipropylene glycol (meth)acrylate, polyethylene glycol (meth)acrylate, polypropylene glycol (meth)acrylate, polyethylene glycol-polypropylene glycol (meth)acrylate, benzyl (meth)acrylate, benzyl (meth)acrylate having a substituent on an aromatic ring (preferably an alkyl group having 1 to 6 carbon atoms, an alkoxy group having 1 to 6 carbon atoms, and a cyano group, as a substituent), 1- or 2-naphthyl (meth)acrylate, 1- or 2-naphthylmethyl (meth)acrylate, phenoxyethyl (meth)acrylate, cresol (meth)acrylate, phenoxydiethylene glycol (meth)acrylate, phenoxytetraethylene glycol (meth)acrylate, phenoxyhexaethylene glycol (meth)acrylate, phenoxypolyethylene glycol (meth)acrylate, p-cumylphenoxyethylene glycol (meth)acrylate, nonylphenoxypolyethylene glycol (meth)acrylate, nonylphenoxypolypropylene glycol (meth)acrylate, tribromophenyl (meth)acrylate, EO-modified tribromophenol (meth)acrylate, 2-(o-phenylphenoxy)ethyl (meth)acrylate, ethoxylated o-phenylphenol (meth)acrylate, (meth)acrylic acid, acrylic acid dimer, 2-acryloyloxyethyl acid phosphate, 2-(meth)acryloyloxyethylsuccinic acid, 2-(meth)acryloyloxyethylphthalic acid, 2-(meth)acryloyloxyethylhexahydrophthalic acid, 2-(meth)acryloyloxypropylphthalic acid, EO-modified succinic acid (meth)acrylate, (meth)acrylamide, N-isopropylacrylamide, N-t-butylacrylamide, diacetone acrylamide, N,N-dimethylacrylamide, N,N-diethylacrylamide, acryloylmorpholine, N-(2-hydroxyethyl)acrylamide, N-[3-(dimethylamino)propyl](meth)acrylamide, 2-acrylamide-2-methylpropanesulfonic acid, N-phenylmaleimide, N-cyclohexylmaleimide, N-vinylformamide, N-vinylpyrrolidone, N-vinylcaprolactam, N-vinylimidazole, and N-vinylcarbazole.

Among monofunctional polymerizable monomeric substances containing the ethylenically unsaturated bond, in view of photocurability, a monofunctional (meth)acrylate compound is preferably used, and a monofunctional acrylate compound is more preferable.

In addition, among monofunctional (meth)acrylate compounds, in view of dry etching resistance, monofunctional (meth)acrylate having an aromatic structure and/or an alicyclic hydrocarbon structure are preferable, and monofunctional (meth)acrylate having an aromatic structure is still more preferable.

Among monofunctional (meth)acrylate having an aromatic structure and/or an alicyclic hydrocarbon structure, benzyl (meth)acrylate, benzyl (meth)acrylate having a substituent on an aromatic ring (preferably an alkyl group having 1 to 6 carbon atoms as a substituent, an alkoxy group having 1 to 6 carbon atoms, and a cyano group), phenoxyethyl (meth)acrylate, 1- or 2-naphthylmethyl (meth)acrylate, isobornyl (meth)acrylate, dicyclopentanyl (meth)acrylate, dicyclopentanyloxyethyl (meth)acrylate, and adamantyl (meth)acrylate are more preferable, and a benzylacrylate having a substituent on an aromatic ring, phenoxyethylacrylate, and 1- or 2-naphthylmethyl (meth)acrylate are particularly preferable.

According to the invention, it is preferable to use a multifunctional polymerizable unsaturated monomeric substance having two or more ethylenically unsaturated bond containing groups as a polymerizable monomeric substance.

Examples of the bifunctional polymerizable unsaturated monomeric substance having two ethylenically unsaturated bond containing groups that can be preferably used in the invention include ethylene glycol di(meth)acrylate, 1,2-propylene glycol di(meth)acrylate, 1,3-butanediol di(meth)acrylate, 1,4-butanediol di(meth)acrylate, neopentyl glycol di(meth)acrylate, 1,6-hexanediol di(meth)acrylate, 1,9-nonanediol di(meth)acrylate, triethylene glycol di(meth)acrylate, tetraethylene glycol di(meth)acrylate, polyethylene glycol di(meth)acrylate, dipropylene glycol di(meth)acrylate, tripropylene glycol di(meth)acrylate, polypropylene glycol di(meth)acrylate, triglycerol di(meth)acrylate, cyclohexanedimethanol di(meth)acrylate, norbornanedimethanoldiacrylate, dimethyloldicyclopentane di(meth)acrylate, dimethyloltricyclodecane di(meth)acrylate, 1,3-adamantanediacrylate, o-,m-,p-benzene di(meth)acrylate, o-,m-,p-xylylene di(meth)acrylate, ethyleneoxide-modified (hereinafter, also referred to as "EO-modified") 1,6-hexanediol di(meth)acrylate, EO-modified neopentyl glycol diacrylate, propyleneoxide-modified (hereinafter, also referred to as "PO-modified") neopentyl glycol diacrylate, EO-modified tripropylene glycol di(meth)acrylate, EO-modified bisphenol A di(meth)acrylate, PO-modified bisphenol A di(meth)acrylate, EO-modified bisphenol F di(meth)acrylate, divinylethylene urea, and divinylpropylene urea.

Among these, particularly, bifunctional (meth)acrylate such as neopentyl glycol di(meth)acrylate, 1,9-nonanediol di(meth)acrylate, tripropylene glycol di(meth)acrylate, tetraethylene glycol di(meth)acrylate, and o-,m-,p-xylylene di(meth)acrylate is suitably used.

Examples of the multifunctional polymerizable unsaturated monomeric substance having three or more ethylenically unsaturated bond containing groups include tris(acryloyloxyethyl)isocyanurate, glycerol tri(meth)acrylate, EO-modified glycerol tri(meth)acrylate, PO-modified glycerol tri(meth)acrylate, trimethylolpropanetri(meth)acrylate, EO-modified trimethylolpropanetri(meth)acrylate, PO-modified trimethylolpropanetri(meth)acrylate, pentaerythritol tetra(meth)acrylate, pentaerythritol ethoxy tetra(meth)acrylate, ditrimethylolpropane tetra(meth)acrylate, dipentaerythritolhexa (meth)acrylate, dipentaerythritol penta(meth)acrylate, and dipentaerythritol poly(meth)acrylate.

Among these, particularly, multifunctional (meth)acrylate such as tris(acryloyloxyethyl) isocyanurate, glycerol tri (meth)acrylate, trimethylolpropane tri(meth)acrylate, pentaerythritol tetra(meth)acrylate, and dipentaerythritol hexa (meth)acrylate is suitably used in the invention.

Among the multifunctional polymerizable unsaturated monomeric substances having two or more ethylenically unsaturated bonds, according to the invention, it is preferable to use multifunctional (meth)acrylate, in view of photocurablility.

It is preferable to contain a polymerizable monomeric substance compound having at least one of a fluorine atom and a silicon atom as a polymerizable monomeric substance that can be used in the invention.

The polymerizable monomeric substance having at least one of a fluorine atom and a silicon atom according to the invention is a compound having at least one selected from a fluorine atom, a silicon atom, or a group having both of a fluorine atom and a silicon atom and at least one polymerizable functional group. As the polymerizable functional group, a (meth)acryloyl group or an epoxy group is preferable.

As a group having the fluorine atom, a fluorine-containing group selected from a fluorine-containing alkyl group and a fluorine-containing polyether group is preferable.

The fluorine-containing alkyl group is preferably a fluorine-containing alkyl group having 2 to 10 carbon atoms and more preferably a fluorine-containing alkyl group having 4 to 8 carbon atoms. Specific examples of the preferable fluorine-containing alkyl group include a 2,2,2-trifluoroethyl group, a 1H,1H-pentafluoropropyl group, a 2H-hexafluoro-2-propyl group, a 1H,1H-heptafluorobutyl group, a 2-(perfluorobutyl)ethyl group, a 3-(perfluorobutyl)propyl group, a 3-(perfluorobutyl)-2-hydroxypropyl group, a 6-(perfluorobutyl)hexyl group, a 1H,1H-undecafluorohexyl group, a 2-(perfluorohexyl)ethyl group, a 3-(perfluorohexyl)propyl group, a 3-(perfluorohexyl)-2-hydroxypropyl group, a 6-(perfluorohexyl)hexyl group, a 1H,1H,3H-tetrafluoropropyl group, a 1H,1H,5H-octafluoropentyl group, a 1H,1H,7H-dodecafluoroheptyl group, and a 1H,1H,9H-hexadecafluorononyl group.

A terminal of the fluorine-containing alkyl group preferably has a trifluoromethyl group structure. If the fluorine-containing alkyl group has the trifluoromethyl group structure, the effect of the invention is exhibited with a small addition amount (for example, 5 mass % or less), and thus line edge roughness after dry etching improves.

Examples of the fluorine-containing polyether group include a fluorine-containing polyether group including a trifluoropropyleneoxide unit, a perfluoroethyleneoxide unit, or a perfluoropropyleneoxide unit, as a repeating unit. In the same manner as the fluorine-containing alkyl group, it is preferable to have a trifluoromethyl group, and a fluorine-containing polyether group having a perfluoropropyleneoxide unit and/or a trifluoromethyl group at a terminal is preferable.

Hereinafter, specific examples of the polymerizable monomeric substance having the fluorine atom used in the composition according to the invention are provided, but the invention is not limited thereto.

As the polymerizable monomeric substance having the fluorine atom, (meth)acrylate such as 2,2,2-trifluoroethyl (meth)acrylate, 1H,1H-pentafluoropropyl (meth)acrylate, 2H-hexafluoro-2-propyl (meth)acrylate, 1H,1H-heptafluorobutyl (meth)acrylate, 2-(perfluorobutyl)ethyl (meth)acrylate, 3-(perfluorobutyl)propyl (meth)acrylate, 3-(perfluorobutyl)-2-hydroxypropyl (meth)acrylate, 6-(perfluorobutyl)hexyl (meth)acrylate, 1H,1H-undecafluorohexyl (meth)acrylate, 2-(perfluorohexyl)ethyl (meth)acrylate, 3-(perfluorohexyl)propyl (meth)acrylate, 3-(perfluorohexyl)-2-hydroxypropyl (meth)acrylate, 6-(perfluorohexyl) hexyl (meth)acrylate, 1H,1H,3H-tetrafluoropropyl (meth)acrylate, 1H,1H,5H-octafluoropentyl (meth)acrylate, 1H,1H,7H-dodecafluoroheptyl (meth)acrylate, 1H,1H,9H-hexadecafluorononyl (meth)acrylate, 2,2,3,3,4,4-hexafluoropentane-1,5-diol di(meth)acrylate, and 2,2,3,3,4,4,5,5-octafluorohexane-1,6-diol di(meth)acrylate are preferable. An epoxy compound such as 3-perfluorobutyl-1,2-epoxypropane, 3-perfluorohexyl-1,2-epoxypropane, 3-(1H,1H,5H- octafluoropentyloxy)-1,2-epoxypropane, 3-(1H,1H,7H-dodecafluoroheptyloxy)-1,2-epoxypropane, 3-(1H,1H,9H-hexadecafluorononyloxy)-1,2-epoxypropane, 1,4-bis(2',3'-epoxypropyl)perfluorobutane, 2,2,3,3,4,4-hexafluoropentane-1,5-dioldiglycidyl ether, 2,2,3,3,4,4,5,5-octafluorohexane-1,6-dioldiglycidyl ether is also preferable.

Among these, 2-(perfluorohexyl)ethyl (meth)acrylate, 3-(perfluorohexyl)propyl (meth)acrylate, and 6-(perfluorohexyl)hexyl (meth)acrylate are particularly preferable in view of releasability and compatibility with the composition.

The content of the polymerizable monomeric substance having at least one of a fluorine atom and a silicon atom in the curable composition for imprinting according to the invention is not particularly limited. However, in view of releasability and compatibility, the content is preferably 0.1 mass % to 20 mass %, more preferably 0.2 mass % to 15 mass %, still more preferably 0.5 mass % to 10 mass %, and particularly preferably 0.5 mass % to 5 mass % with respect to the total polymerizable monomeric substance.

Polymerizable Compound Having Silicon Atom

According to the invention, the polymerizable compound having a silicon atom may be contained. Examples of the functional group having the silicon atom included in the polymerizable compound having the silicon atom include a trialkylsilyl group, a chain-shaped siloxane structure, a cyclic siloxane structure, and a cage-shaped siloxane structure. In view of compatibility with another component and releasability of the mold, a trimethylsilyl group or a functional group having a dimethylsiloxane structure is preferable.

Examples of the polymerizable compound having a silicon atom include polysiloxane (for example, X-22-164 series, X-22-174DX, X-22-2426, X-22-2475 manufactured by Shin-Etsu Chemical Co., Ltd.) having 2-(trimethylsilyl)ethyl (meth)acrylate, 3-[tris(trimethylsilyloxy)silyl]propyl (meth)acrylate, (meth)acryloxymethylbis(trimethylsiloxy)methylsilane, (meth)acryloxymethyltris(trimethylsiloxy)silane, 3-(meth)acryloxypropylbis(trimethylsiloxy)methylsilane, or (meth)acryloyl group at a terminal or a side chain.

As the polymerizable compound used in the composition according to the invention, a (meth)acrylate compound is preferable. Particularly, in view of etching resistance, a (meth)acrylate compound having an alicyclic hydrocarbon group and/or an aromatic group is more preferable, and an (meth)acrylate compound having an aromatic group is still more preferable. In addition, the polymerizable compound having the silicon atom and/or the fluorine atom may be contained. However, according to the invention, if the compound expressed by General Formula (I) is blended, even if the polymerizable compound having the silicon atom and/or the fluorine atom is not substantially included, low releasing force can be achieved. The expression "being not substantially included" means that a blending amount of the compound expressed by General Formula (I) is 1 mass % or less.

Among the components of the total polymerizable compound included in the composition according to the invention, the sum of the polymerizable compound having the alicyclic hydrocarbon group and/or the aromatic group is preferably 30 mass % to 100 mass %, more preferably 50 mass % to 100 mass %, and still more preferably 70 mass % to 100 mass % with respect to the total polymerizable compound.

The content of the (meth)acrylate polymerizable compound containing the aromatic group as the polymerizable compound is preferably 30 mass % to 100 mass %, more preferably 50 mass % to 100 mass %, and particularly preferably 70 mass % to 100 mass % with respect to the total polymerizable component.

In the particularly preferable embodiment, the content of a polymerizable compound (A1) below is 0 mass % to 80 mass % of the total polymerizable component and preferably 0 mass % to 50 mass %, and a polymerizable compound (A2) below is 20 mass % to 100 mass % of the total polymerizable component or preferably 50 mass % to 100 mass %.

(A1) Polymerizable compound having an aromatic group (preferably a phenyl group or a naphthyl group, and still more preferably naphthyl group) and one (meth)acrylate group (A2) Polymerizable compound containing an aromatic group (preferably a phenyl group or a naphthyl group and still more preferably a phenyl group) and having two (meth)acrylate groups Photopolymerization Initiator (B)

The photopolymerization initiator is included in the composition according to the invention. As the photopolymerization initiator used in the invention, any compound can be used as long as the compound is a compound generating active species for polymerizing the polymerizable compound described above, due to photoirradiation. As the photopolymerization initiator, a radical polymerization initiator and a cation polymerization initiator are preferable, and a radical polymerization initiator is more preferable. In addition, according to the invention, plural types of the photopolymerization initiator may be used together.

As the radical photopolymerization initiator used in the invention, for example, commercially available initiators can be used. As these examples, for example, initiators disclosed in paragraph "0091" of JP2008-105414A can be preferably employed. Particularly, among these, an acetophenone-based compound, an acylphosphine oxide-based compound, and an oxime ester-based compound are preferable in view of curing sensitivity and absorption characteristics.

Preferable examples of the acetophenone-based compound include a hydroxyacetophenone-based compound, a dialkoxyacetophenone-based compound, and a aminoacetophenone-based compound. Preferable examples of the hydroxyacetophenone-based compound include IRGACURE (Registered trademark) 2959, IRGACURE 184, IRGACURE 500, and DAROCUR (Registered trademark) 1173 obtainable from BASF AG.

Preferable examples of the dialkoxyacetophenone-based compound include IRGACURE 651 obtainable from BASF AG.

Preferable examples of the aminoacetophenone-based compound include IRGACURE 369, IRGACURE 379, and IRGACURE 907 obtainable from BASF AG.

Preferable examples of the phenylglyoxylate-based compound include IRGACURE 754 and DAROCUR MBF obtainable from BASF AG.

Preferable examples of the acylphosphineoxide-based compound include IRGACURE 819, IRGACURE 1800, LUCIRIN (Registered trademark) TPO, and LUCIRIN TPO-L obtainable from BASF AG.

Preferable examples of the oxime ester-based compound include IRGACURE OXE01 and IRGACURE OXE02 obtainable from BASF AG.

As the cation photopolymerization initiator that can be used in the invention, a sulfonium salt compound, an iodonium salt compound, and an oximesulfonate compound are preferable, and examples thereof include PI2074 manufactured by Rhodia, and IRGACURE 250 manufactured by BASF AG, IRGACURE PAGs 103, 108, 121, and 203 (manufactured by BASF AG).

In addition, it is preferable to use two or more types of the photopolymerization initiator together. In case two or more types are used together, it is more preferable to use two or more types of the radical polymerization initiators. Specifically, combinations between DAROCUR 1173 and IRGACURE 907, between DAROCUR 1173 and LUCIRIN TPO, between DAROCUR 1173 and IRGACURE 819, between DAROCUR 1173 and IRGACURE OXE01, between IRGACURE 907 and LUCIRIN TPO, and between IRGACURE 907 and IRGACURE 819 are exemplified. In these combinations, a photoexposure margin can be expanded.

A preferable ratio (mass ratio) in case the photopolymerization initiator is used together is preferably 9:1 to 1:9, more preferably 8:2 to 2:8, and still more preferably 7:3 to 3:7.

In addition, in "light" according to the invention, not only light having a wavelength in ultraviolet, near ultraviolet, far ultraviolet, visible, and infrared ranges or an electromagnetic wave but also a radioactive ray is included. In the radioactive ray, for example, a microwave, an electron beam, EUV, and X-ray are included. In addition, laser light such as a 248 nm excimer laser, a 193 nm excimer laser, and a 172 nm excimer laser can be used. As this light, monochrome light (single wavelength light) through an optical filter may be used, and may be light having different plural wavelengths (complex light).

The content of the photopolymerization initiator used in the invention is, for example, 0.01 mass % to 15 mass %, preferably 0.1 mass % to 10 mass %, and more preferably 0.5 mass % to 7 mass % with respect to the total composition except for the solvent. In case two or more types of the photopolymerization initiators are used, the total amount thereof are in the range described above. It is preferable that the content of the photopolymerization initiator is 0.01 mass % or greater, since there is a tendency in that increasing sensitivity (fast curability), resolution, line edge roughness properties, and coating film strength improve. In addition, it is preferable that the content of the photopolymerization initiator is 15 mass % or less, since there is a tendency in that light transmittance, colorability, handleability, and the like improve.

Compound Expressed by General Formula (I)

The compound expressed by General Formula (I) is included in the composition according to the invention. If these compounds are used, it is possible to improve ink jet adequacy and releasability of the composition according to the invention.

Though the mechanism that ink jet adequacy and releasability improve if the compound expressed by General Formula (I) is included is not clear, even if the compound expressed by General Formula (I) is added to composition, since changes in the surface tension or the viscosity are small, the ink jet adequacy is not deteriorated. In addition, it is considered that the compound expressed by General Formula (I) works as a plasticizer with respect to the photocured product of the composition and decreases elasticity of the photocured product, and as a result, releasing force decreases.

General Formula (I)

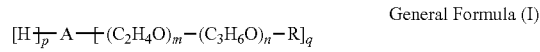

(In General Formula (I), A represents a dihydric to hexahydric polyhydric alcohol residue. p represents 0 to 2, q represents 1 to 6, p+q represents an integer of 2 to 6, each of m and n independently represents 0 to 20. r expressed by Formula (1) below is 6 to 20. Each of R independently represents an alkyl group having 1 to 10 carbon atoms, an aryl group, or an acyl group.)

$$r = (\text{sum of } m) + (\text{sum of } n) \tag{1}$$

In General Formula (I), A represents a dihydric to hexahydric polyhydric alcohol residue, a dihydric to tetrahydric alcohol residue is preferable, and a trihydric alcohol residue is more preferable. The N-hydric alcohol residue represents a group in which N hydrogen atoms are removed from N alcoholic hydroxy groups in a molecule structure of N-hydric alcohol. The polyhydric alcohol according to the invention means that not only a monomeric substance of polyhydric alcohol but also a polymer is included. The molecular weight of the polyhydric alcohol according to the invention is preferably 60 to 260 and more preferably 60 to 140. The polyhydric alcohol used in the invention is preferably polyhydric alcohol (monomeric substance) made of a straight chain or branched saturated aliphatic hydrocarbon group and 2 to 6 alcoholic hydroxy groups or a polymer thereof, more preferably a monomeric substance or a dimer or a trimer thereof, still more preferably a monomeric substance or a dimer thereof, and particularly preferably a monomeric substance.

The number of carbon atoms forming the polyhydric alcohol residue according to the invention is preferably 2 to 10, more preferably 2 to 6, and still more preferably 3 to 5.

For example, examples of dihydric alcohol include ethylene glycol, propylene glycol, 1,4-butanediol, neopentyl glycol, 1,6-hexanediol, and 1,9-nonanediol, and examples of trihydric alcohol include glycerol, trimethylolethane, and trimethylolpropane. Examples of tetrahydric alcohol include erythritol, pentaerythritol, diglycerol, and ditrimethylolpropane. Examples of the pentahydric or hexahydric alcohol include xylitol, sorbitol, mannitol, and dipentaerythritol. Among these, neopentyl glycol, glycerol, trimethylolpropane, diglycerol, and pentaerythritol are more preferable, and glycerol is still more preferable.

In General Formula (I), p represents 0 to 2, q represents 1 to 6, p+q represents an integer of 2 to 6. It is more preferable that p represents 0 to 1, and q represents 2 to 4. It is still more preferable that p represents 0, and q represents 2 or 3. It is most preferable that p is 0, and q is 3.

In General Formula (I), each of m and n independently represents 0 to 20, and r expressed by Formula (1) below represents 6 to 20.

$$r = (\text{sum of } m) + (\text{sum of } n) \tag{1}$$

m and n represent average numbers of addition of ethyleneoxide and propyleneoxide. Each of m and n independently represents 0 to 20, preferably 0 to 15, and more preferably 0 to 12. In case both of m and n are 2 or greater, the distribution thereof may be random or may be blocked. Among these, it is more preferable that m or n is 0, and it is still more preferable that m is 0, and n is 3 to 7.

r is 6 to 20 and more preferably 8 to 15. If r is smaller than 6, releasability does not improve. Meanwhile, if r is greater than 20, viscosity increases, and thus ink jet adequacy is deteriorated.

In General Formula (I), R represents an alkyl group having 1 to 10 carbon atoms, an aryl group, or an acyl group.

As the alkyl group having 1 to 10 carbon atoms, an alkyl group having 1 to 6 carbon atoms is preferable, and an alkyl group having 1 to 4 carbon atoms is more preferable. Examples of the alkyl group having 1 to 10 carbon atoms include a methyl group, an ethyl group, propyl group, an isopropyl group, a butyl group, an isobutyl group, a hexyl group, an octyl group, a 2-ethylhexyl group, and a benzyl group.

As the aryl group, an aryl group having 6 to 10 carbon atoms is preferable, and an aryl group having 6 to 8 carbon atoms is more preferable. Examples of the aryl group include a phenyl group and a naphthyl group.

As the acyl group, an acyl group having 2 to 10 carbon atoms is preferable, an acyl group having 2 to 7 carbon atoms is more preferable, and an acyl group having 2 to 4 carbon atoms is still more preferable. Examples of the acyl group include an acetyl group, a propionyl group and a benzoyl group.

Among these, a methyl group, a butyl group, and acetyl group is more preferable, and a methyl group is still more preferable. In addition, q items of R's included in a molecule structure may be identical to or different from each other.

Preferable specific examples of the compound expressed by General Formula (I) include compounds C-1 to C-16 below, but the invention is not limited thereto. In addition, the compound expressed by General Formula (I) may not be a single compound, but a mixture having a distribution over a molecular weight or a number of addition of alkyleneoxide, and the number of repeating units in a specific example below is to exemplify a representative structure by calculating an average number of addition of alkyleneoxide from an average molecular weight and optionally allocating a number of addition of alkyleneoxide to respective hydroxy groups of polyhydric alcohol.

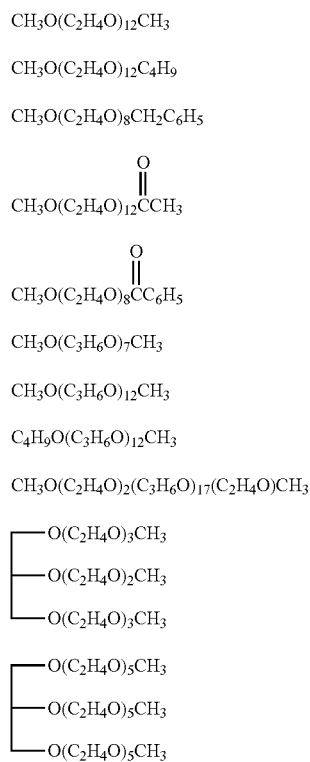

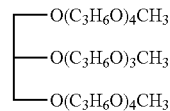

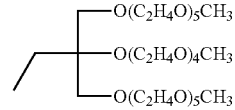

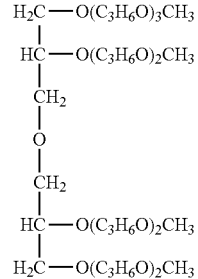

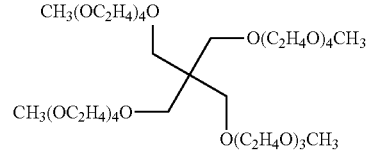

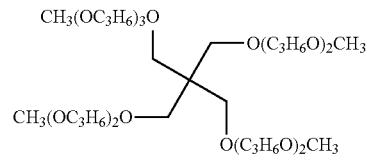

In addition, as a commercially available product, UNIOX MM-550 (manufactured by NOF Corporation) and the like can be preferably used.

The molecular weight of the compound (C) expressed by General Formula (I) is preferably 400 to 1,500, more preferably 500 to 1,200, and still more preferably 600 to 1,000.

The content of the compound (C) expressed by General Formula (I) in the composition according to the invention is preferably 3 mass % to 15 mass %, more preferably 4 mass % to 12 mass %, and still more preferably 5 mass % to 10 mass % with respect to the total composition except for the solvent. If the content of the compound (C) expressed by General Formula (I) is 3 mass % or greater, releasability improves. In addition, if the content of the compound (C) expressed by General Formula (I) is 15 mass % or less, a pattern shape becomes better. The compound (C) expressed by General Formula (I) may be used singly or two or more types thereof may be used in combination. In case two or more types thereof are used, the total amount thereof becomes the range described above.

Polymerization Inhibitor

It is preferable that a polymerization inhibitor is contained in the composition according to the invention. In case the composition according to the invention contains a polymerization inhibitor, the content of the polymerization inhibitor is 0.001 mass % to 1 mass %, more preferably 0.005 mass % to 0.5 mass %, and still more preferably 0.008 mass % to 0.05 mass % with respect to the total polymerizable monomeric substance. The polymerization inhibitor may be used singly, or two or more types thereof may be mixed to be used. In case two or more types of the polymerization inhibitors are used, the total amount thereof becomes the range described above. If the polymerization inhibitor is contained in a proper blending amount, high curing sensitivity is maintained, and viscosity change with time can be prevented. The polymerization inhibitor may be added at the time of manufacturing the polymerizable monomeric substance or may be added to the curable composition according to the invention thereafter. Specific examples of the polymerization inhibitor include polymerization inhibitors disclosed in paragraph "0121" of JP2012-169462A, and the contents thereof are incorporated in this specification.

Preferable examples of the polymerization inhibitor that can be used in the invention include hydroquinone, p-methoxy phenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), N-nitrosophenylhydroxyamine first cerium salt, phenothiazine, phenoxazine, 4-methoxynaphthol, 2,2,6,6-tetramethylpiperidine-1-oxyl free radical, 2,2,6,6-tetramethylpiperidine, 4-hydroxy-2,2,6,6-tetramethylpiperidine-1-oxyl free radical, nitrobenzene, and dimethylaniline. Particularly, phenothiazine, 4-methoxynaphthol, 2,2,6,6-tetramethylpiperidine-1-oxyl free radical, 2,2,6,6-tetramethylpiperidine, and 4-hydroxy-2,2,6,6-tetra methyl piperidine-1-oxyl free radical, which have a high effect even if oxygen does not coexist are preferable.

Surfactant

A surfactant may be contained in the composition according to the invention, if necessary. As the surfactant used in the invention, a nonionic surfactant is preferable, at least one type of a fluorine-based surfactant, a Si-based surfactant, and a fluorine.Si-based surfactant is more preferable, and a fluorine-based nonionic surfactant is most preferable. Here, the "fluorine.Si-based surfactant" refers to a surfactant satisfying both requirements of a fluorine-based surfactant and a Si-based surfactant.

Examples of the nonionic fluorine-based surfactant used in the invention include a product name of FLUORAD FC-430 and FC-431 (manufactured by Sumitomo 3M Limited), a product name of SURFLON S-382 (manufactured by Asahi Glass Co., Ltd.), EFTOP EF-122A, 122B, 122C, EF-121, EF-126, EF-127, and MF-100 (manufactured by Tochem Products Co., Ltd.), a product name of PF-636, PF-6320, PF-656, and PF-6520 (all manufactured by OMNOVA Solutions, Inc.), a product name of FTERGENT FT250, FT251, and DFX18 (all manufactured by Neos Co., Ltd.), a product name of UNIDYNE DS-401, DS-403, and DS-451 (all manufactured by DAIKIN Industries, Ltd.), and a product name of MEGAFAC 171, 172, 173, 178K, 178A, and F780F (all manufactured by DIC Corporation).

In addition, examples of the nonionic Si-based surfactant include a product name of SI-10 series (manufactured by Takemoto Oil & Fat Co., Ltd.), MEGAFAC PAINTAD 31 (DIC Corporation), and KP-341 (manufactured by Shin-Etsu Chemical Co., Ltd.).

In addition, examples of the fluorine.Si-based surfactant include a product name of X-70-090, X-70-091, X-70-092, and X-70-093 (all manufactured by Shin-Etsu Chemical Co., Ltd.), and a product name of MEGAFAC R-08, XRB-4 (all manufactured by DIC Corporation).

In case the composition according to the invention contains the surfactant, the content of the surfactant is 0.001 mass % to 5 mass %, preferably 0.002 mass % to 4 mass %, and still more preferably 0.005 mass % to 3 mass % with respect to the total composition. The surfactant may be used singly or two or more types thereof may be mixed to be used. In case two or more types of surfactants are used, the total amount is in the range described above. If the content of the surfactant is in the range of 0.001 mass % to 5 mass % with respect to the composition of the invention, the effect of the evenness of the application is satisfactory, and the deterioration of the mold transferring characteristics caused by an excessive surfactant hardly occurs.

According to the invention, low releasing force can be achieved by blending the compound expressed by General Formula (I), even if the surfactant is not substantially included. The expression "being not substantially included" means that, for example, the content of the surfactant is 1 mass % or less of the blending amount of the compound expressed by General Formula (I).

Other Components

In addition to the component described above, a photosensitizer, an antioxidant, an ultraviolet absorber, a light stabilizer, an antiaging agent, a plasticizer, an adhesion accelerator, a thermal polymerization initiator, a photobase generator, a colorant, inorganic particles, elastomer particles, a basic compound, a photoacid generator, a photoacid amplifier, a chain transfer agent, an antistatic agent, a fluidity controlling agent, a defoaming agent, a dispersant, or the like may be added to the composition according to the invention, if necessary. Specific examples of the component include components disclosed in paragraphs "0092" to "0093" and paragraphs "0113" to "0137" of JP2008-105414A, and the contents thereof are incorporated in this specification. These compounds may be used singly or two or more types thereof may be mixed to be used.

According to the invention, if the compound expressed by General Formula (I) is blended, low releasing force can be achieved, even if a silane coupling agent having a perfluoro group or a polymerizable compound having an alkyl group including two or more fluorine atoms is not substantially included. In addition, according to the invention, if a silane coupling agent having a perfluoro group is not substantially included, it is possible to prevent the deterioration of the preservation stability of the curable composition, and the defects of the imprinting pattern can be prevented. The expression "being not substantially included" means that the content of the silane coupling agent is, for example, 1 mass % or less of the blending amount of the compound expressed by General Formula (I).

Solvent

In addition, in the composition according to the invention, a solvent can be used, but it is preferable that the content there of is 5 mass % or less and more preferably 3 mass % or less, and it is particularly preferable that the solvent is not substantially contained. In case the composition according to the invention is applied to the substrate in the ink jet method, if the blending amount of the solvent is small, the viscosity change of the composition due to the volatilization of the solvent can be suppressed, and thus it is preferable that the blending amount of the solvent is small.

In this manner, the composition according to the invention does not necessarily include the solvent, but the solvent may be optionally added at the time of finely adjusting the viscosity of the composition or the like. The type of the solvent that can be preferably used in the composition according to the invention is the curable composition for optical imprinting or a solvent that is generally used as a photoresist, and may be a solvent that dissolves or evenly disperses the compound used in the invention. In addition, the solvent is not particularly limited, as long as the solvent does not react with these components. Examples of the solvent used in the invention include paragraph "0088" of JP2008-105414A, and the contents thereof are incorporated in this specification. In case of using the solvent, one type thereof may be used singly, or two or more types thereof may be mixed to be used.

The composition according to the invention can be adjusted by mixing respective components described above. The mixing and dissolving of the composition according to the invention is generally performed in the range of 0° C. to 100° C. In addition, after the respective components are mixed, it is preferable that the components are filtrated, for example, with a filter having a hole diameter of 0.003 μm to 5.0 μm. The filtration is performed in multiple steps or may be repeated several times. In addition, the filtrated liquid may be re-filtrated. As the material of the filter used in the filtration, a polyethylene resin, a polypropylene resin, a fluorine resin, or a nylon resin, or the like may be used, but the material of the filter is not particularly limited.

With respect to the composition according to the invention, the viscosity at 23° C. is preferably 15 mPa·s or less, more preferably 12 mPa·s or less, and still more preferably 11 mPa·s or less. If the viscosity is caused to be in this range, ink jet (IJ) ejection properties or pattern forming properties can be improved. In the composition according to the invention, in order to decrease the viscosity as above while the blending amount of the solvent is reduced, it is preferable to blend a component that works as a reaction diluent, as the polymerizable compound (A). As the polymerizable compound that works as the reaction diluent, for example, monofunctional (meth)acrylate is exemplified. In addition, the viscosity can be measured, for example, by an E-type viscometer.

In addition, with respect to the composition according to the invention, the surface tension is preferably in the range of 25 mN/m to 35 mN/m, more preferably in the range of 27 mN/m to 34 mN/m, and still more preferably in the range of 28 mN/m to 32 mN/m. If the surface tension is in this range, the IJ ejection properties or the surface smoothness can be improved. Particularly, with respect to the composition according to the invention, it is preferable that the viscosity at 23° C. is 15 mPa·s or less and the surface tension thereof is 25 mN/m to 35 mN/m. In addition, the surface tension can be measured, for example, in a plate method (Wilhelmy method).

Pattern Forming Method

Hereinafter, a pattern forming method (pattern transferring method) using the composition according to the invention is described in detail. In the pattern forming method according to the invention, first, the composition according to the invention is applied on the base material and the mold having the fine pattern, and photoirradiation is performed in a state in which the composition according to the invention is interposed between the mold and the base material.

As the method of applying the composition according to the invention on the base material, a generally known application method, for example, a dip coating method, an air knife coating method, a curtain coating method, a wire bar coating method, a gravure coating method, an extrusion coating method, a spin coating method, a slit-scan method, or an ink jet method, is used such that a coating film or a droplet can be distributed on the base material. Particularly, the composition according to the invention contains the compound expressed by General Formula (I) described above, and thus even in case the ink jet method is used, the ink jet ejection properties can be caused to be satisfactory.

The composition according to the invention is particularly appropriate for the ink jet method. In addition, the film thickness of the pattern forming layer made of the composition according to the invention is different depending on the use thereof, the composition according to the invention is about 0.03 μm to 30 μm. In addition, the composition according to the invention can be applied by multiple applications. In the method of providing droplet on the base material in the ink jet method, the amount of the droplet is preferably about 1 pl to 20 pl, and it is preferable that the droplet is provided on the base material with an interval. Further, another organic layer such as a planar layer between the base material and the pattern forming layer made of the composition according to the invention may be formed. In this manner, since the pattern forming layer and the substrate does not directly come in contact with each other, attachment of the waste to the substrate or the damage on the substrate may be prevented. Further, the pattern formed with the composition according to the invention has excellent adhesiveness to the organic layer even in case the organic layer is provided on the base material.

The base material (substrate or support) for applying the curable composition for imprinting according to the invention can be selected depending on various uses, examples thereof include quartz, glass, an optical film, a ceramic material, a deposition film, a magnetic film, a reflective film, a substrate of metal such as Ni, Cu, Cr, and Fe, paper, spin on glass (SOG), a polymer substrate such as a polyester film, a polycarbonate film, and a polyimide film, a TFT array substrate, an electrode substrate of PDP, a glass or transparent plastic substrate, a conductive base material such as ITO or metal, an insulating base material, and a semiconductor manufacturing substrate such as silicon, silicon nitride, polysilicon, silicon oxide, and amorphous silicon, and the base material is not particularly limited. In addition, the shape of the base material is not particularly limited, and may be a plate shape or a roll shape. In addition, as the base material as described above, depending on the combination with the mold, light transmitting or non-light transmitting base material can be selected.

As the mold that can be used in the invention, a mold having a pattern to be transferred is used. The pattern on the mold can be formed according to the desired processing precision, for example, in photolithography or an electron beam lithographic method. However, according to the invention, the mold pattern forming method is not particularly limited.

With the composition according to the invention, satisfactory pattern forming properties can be obtained even when the pattern is transferred by using the mold of which the minimum pattern size is 50 nm or less.

The light transmitting mold material used in the invention is not particularly limited, but the light transmitting mold material may be a material having predetermined strength and durability. Specifically, a light transparent resin such as glass, quartz, PMMA, and a polycarbonate resin, a transparent metal deposition film, a flexible film such as polydimethylsiloxane, a photocuring film, and a metal film are exemplified.

The light non-transmitting type mold material used in case of using a light transmitting base material according to the invention is not particularly limited, but the light non-transmitting type mold material may be a material having a predetermined strength. Specifically, a ceramic material, a deposition film, a magnetic film, a reflective film, a substrate of metal such as Ni, Cu, Cr, and Fe, and a substrate such as Sic, silicon, silicon nitride, polysilicon, silicon oxide, and amorphous silicon are exemplified, and the light non-transmitting type mold material is not particularly limited. In addition, the shape of the mold is not particularly limited, and the mold may be a plate-shaped mold, or a roll-shaped mold. The roll-shaped mold is applied in case transferring continuous productivity is required.

The mold used in the pattern forming method according to the invention improves releasability of the curable composition and the mold surface, and thus it is preferable that a mold subjected to the releasing treatment may be used. As the mold, a mold subjected to a treatment by a silane coupling agent such as a silicon-based agent or a fluoride-based agent, for example, a commercially available releasing agent such as OPTOOL DSX manufactured by Daikin Industries, Ltd. or NOVEC EGC-1720 manufactured by Sumitomo 3M Limited, and the like can be suitably used. The composition according to the invention exhibits excellent pattern forming properties even if a mold which is not subjected to a releasing treatment is used.

In case optical imprinting lithography is performed by using the composition according to the invention, in the pattern forming method according to the invention, it is preferable to perform the optical imprinting lithography, generally, in a mold pressure of 10 atmospheric pressure or less. If the mold pressure is 10 atmospheric pressure or less, the mold or the substrate is hardly deformed, and pattern precision tends to improve. In addition, since the pressure is low, a device may be reduced, and thus it is preferable that the mold pressure is 10 atmospheric pressure or less. It is preferable that the mold pressure selects an area that can secure the mold transferring evenness in a range in which a residual film of the curable composition on a convex portion of the mold becomes less.

In the optical imprinting lithography applied to the invention, the substrate temperature at the time of photoirradiation is generally room temperature, but photoirradiation may be performed while heating, in order to increase reactivity. If the mold is caused to be in the vacuum state in a preliminary stage of the photoirradiation, there is an effect of preventing introduction of bubbles, suppressing decrease of reactivity due to oxygen contamination, and improving adhesiveness between the mold and the curable composition, and thus photoirradiation may be performed in a vacuum state. In addition, in the pattern forming method according to the invention, a preferable vacuum degree at the time of photoirradiation is in the range of $10^{-1}$ Pa to normal pressure.

The light used for curing the composition according to the invention is not particularly limited, and examples thereof include a high energy ionizing radioactive ray, light having a wavelength in near ultraviolet, far ultraviolet, visible, and infrared ranges, or a radioactive ray. As the high-energy ionizing radiation source, for example, electron beams accelerated by an accelerators such as a Cockcroft accelerator, a van de Graaff accelerator, a linear accelerator, betatoron, and cyclotron are most conveniently and economically used, but a radioactive isotope or another radiation such as a $\gamma$ ray, an X ray, an $\alpha$ ray, a neutron beam, and a proton beam, which are radiated from a nuclear reactor can be used. Examples of the ultraviolet source include a ultraviolet fluorescent lamp, a low pressure mercury lamp, a high pressure mercury lamp, an ultra high pressure mercury lamp, a xenon lamp, a carbon arc lamp, and a solar lamp. Examples of the radiation include a microwave and EUV. In addition, a laser ray such as LED, a semiconductor laser ray, a 248 nm KrF excimer laser ray, a 193 nm ArF excimer laser ray, which is used in microprocessing of a semiconductor can be suitably used in the invention. This light may use monochromatic light or may be light having different plural wavelengths (mixed light).

In the photoexposure, the light intensity is desirably in the range of 1 mW/cm$^2$ to 200 mW/cm$^2$. If the light intensity is 1 mW/cm$^2$ or greater, the photoexposure time may be reduced, and thus the producibility may increase. If the light intensity is 200 mW/cm$^2$ or less, the deterioration of the characteristics of a cured film caused by the occurrence of the side reaction is prevented, and thus it is preferable that the light intensity is 200 mW/cm$^2$ or greater. It is preferable that the photoexposure amount is in the range of 5 mJ/cm$^2$ to 1,000 mJ/cm$^2$. If the photoexposure amount is less than 5 mJ/cm$^2$, photoexposure margin may be narrowed down, photocuring may be insufficient, and thus there may occur problems in that an unreacted matter may adhere to mold. Meanwhile, if the photoexposure amount is greater than 1,000 mJ/cm$^2$, there is a concern in that the cured film is deteriorated due to the decomposition of the composition.

Further, at the time of photoexposure, in order to prevent the inhibition of the radical polymerization due to oxygen, the oxygen concentration can be controlled to be less than 100 mg/L by causing inert gas such as nitrogen, helium, argon, or carbon dioxide to flow.

The pattern forming method according to the invention may include a step of further curing the pattern forming layer by adding heat to the cured pattern, if necessary after the pattern forming layer (layer made of the composition according to the invention) is cured by photoirradiation. The heat for heating and curing the composition according to the invention after the photoirradiation is preferably 150° C. to 280° C. and more preferably 200° C. to 250° C. In addition, the time for applying heat is preferably 5 minutes to 60 minutes and still more preferably 15 minutes to 45 minutes.

The specific examples of the pattern forming method include pattern forming methods disclosed in paragraphs "0125" to "0136" of JP2012-169462A, and the contents thereof are incorporated in this specification.

In addition, the pattern forming method according to the invention include a step of forming an underlayer film by applying an underlayer film composition on the base material, a step of applying the composition according to the invention to the underlayer film surface, a step of curing the composition according to the invention by performing photoirradiation in a state in which the composition according to the invention and the underlayer film are interposed between the base material and the mold having the fine pattern, and a step of separating the mold. Further, the underlayer film composition is applied to the base material, a portion of the underlayer film composition is cured by heat or photoirradiation, and the composition according to the invention may be applied.

For example, the underlayer film composition includes a curable main agent. The curable main agent may be thermosetting or photosetting, and thermosetting is preferable. It is preferable that the molecular weight of the curable main agent is 400 or greater, and the curable main agent may be a low molecular compound or a polymer, but a polymer is preferable. The molecular weight of the curable main agent is preferably 500 or greater, more preferably 1,000 or greater, and still more preferably 3,000 or greater. The upper limit of the molecular weight is preferably 200,000 or less, more preferably 100,000 or less, and still more preferably 50,000 or less. If the molecular weight is 400 or greater, it is possible to effectively prevent volatilization of the component. For example, examples thereof include curable main agents disclosed in paragraphs "0040" to "0055" of JP2009-503139A, and the contents thereof are incorporated in this specification. These compounds may be used singly or two or more types thereof may be mixed to be used.

According to the invention, for example, compounds described below can be used.

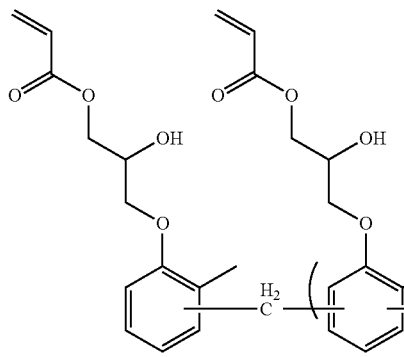 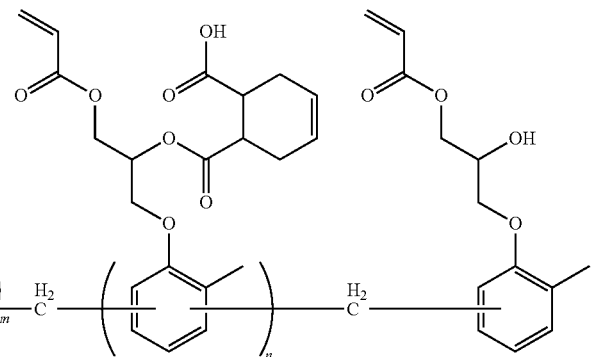

Average $m+n=4$, average $n/(m+n)=0.5$

The content of the curable main agent is preferably 30 mass % or greater, more preferably 50 mass % or greater, and still more preferably 70 mass % or greater with respect to the total components except for the solvent. If two or more types of the curable main agent may be used, it is preferable that the total amount is in the range described above, in this case.

It is preferable that the underlayer film composition contains the solvent. A preferable solvent is a solvent having a boiling point of 80° C. to 200° C. in normal pressure. As a type of the solvent, all solvents that can dissolve the underlayer film composition can be used. However, the solvent is preferably a solvent having any one or more of an ester structure, a ketone structure, a hydroxy group, and an ether structure. Specifically, a preferable solvent is a single or mixed solvent selected from propylene glycol monomethyl ether acetate, cyclohexanone, 2-heptanone, gamma-butyrolactone, propylene glycol monomethyl ether, and ethyl lactate, a solvent containing propylene glycol monomethyl ether acetate is most preferable in view of application evenness.

The content of the solvent in the underlayer film composition is optimally adjusted by viscosity of the component except for the solvent, application properties, and intended film thickness. However, in view of application properties improvement, the content of the solvent is added in the range of 70 mass % or greater in the total composition, preferably 90 mass % or greater, more preferably 95 mass % or greater, and still more preferably 99 mass % or greater. The solvent may be used singly, and two or more types thereof may be mixed to be used.

As another component, the underlayer film composition may contain at least one of a surfactant, a heat polymerization initiator, a polymerization inhibitor, and a catalyst. The blending amount thereof is preferably 50 mass % or less with respect to the total components except for the solvent. These compounds may be used singly or two or more types thereof may be mixed to be used.

The underlayer film composition can be adjusted by mixing respective components described above. In addition, after the respective components are mixed, it is preferable that the components are filtrated, for example, with a filter having a hole diameter of 0.003 μm to 5.0 μm. The filtration is performed in multiple steps or may be repeated several times. In addition, the filtrated liquid may be re-filtrated. As the material of the filter used in the filtration, a polyethylene resin, a polypropylene resin, a fluorine resin, or a nylon resin, or the like may be used, but the material of the filter is not particularly limited.

The underlayer film composition is applied on the base material, so as to form the underlayer film. As the method of applying the composition on the base material, for example, a dip coating method, an air knife coating method, a curtain coating method, a wire bar coating method, a gravure coating method, an extrusion coating method, a spin coating method, a slit-scan method, or an ink jet method is used such that a coating film or a droplet can be distributed on the base material. In view of film thickness evenness, a spin coating method is more preferable. Thereafter, the solvent is dried. A preferable drying temperature is 70° C. to 130° C. Preferably, curing is further performed with an active energy (preferably, heat and/or light). Preferably, heating and curing is performed at the temperature of 150° C. to 250° C. A step of drying the solvent and a step of curing the solvent may be performed at the same time. In this manner, it is preferable that the composition according to the invention is applied, after the underlayer film composition is applied, and a portion of the underlayer film composition is cured by heat or photoirradiation. If this method is employed, when the composition according to the invention is photocured, the underlayer film composition is also completely cured, and the adhesiveness tends to more improve.

Though the film thickness is different depending on the use, the film thickness of the underlayer film made of the composition according to the invention is about 0.1 nm to 100 nm, preferably 0.5 nm to 20 nm, and still more preferably 1 nm to 10 nm. In addition, the underlayer film composition may be applied by multiple applications. It is preferable that the obtained underlayer film is as flat as possible.

The base material (substrate or support) can be selected depending on various uses, examples thereof include quartz, glass, an optical film, a ceramic material, a deposition film, a magnetic film, a reflective film, a base material of metal such as Ni, Cu, Cr, and Fe, paper, spin on glass (SOG), a polymer base material such as a polyester film, a polycarbonate film, and a polyimide film, a TFT array base material, an electrode substrate of PDP, a glass or transparent plastic base material, a conductive base material such as ITO or metal, an insulating base material, and a semiconductor manufacturing base material such as silicon, silicon nitride, polysilicon, silicon oxide, and amorphous silicon, and the base material is not particularly limited. However, in case of being used for etching, a semiconductor manufacturing base material is preferable.

Fine Pattern

The fine pattern formed in the pattern forming method in the invention as described above can be used as a permanent film (resist for a structure member) or an etching resist used in the liquid crystal display (LCD) or the like.

In addition, the pattern using the composition according to the invention has satisfactory solvent resistance. It is preferable that the curable composition according to the invention has high resistance to multiple types of solvents, but a pattern of which the film thickness is not changed in case the pattern is immersed in a solvent used at the time of a general base manufacturing step, for example, a N-methylpyrrolidone solvent at 25° C. for 10 minutes is particularly preferable.

The pattern formed in the pattern forming method according to the invention is also useful as an etching resist. In case the composition according to the invention is used as the etching resist, first, a silicon wafer on which a thin film of $SiO_2$ or the like is formed as a base material or the like is used, and a nano-order fine pattern is formed on the base material in the pattern forming method according to the invention. Thereafter, a desired pattern can be formed by using hydrogen fluoride in case of wet etching and etching gas such as $CF_4$ in case of dry etching and performing etching. It is preferable that the composition according to the invention has satisfactory etching resistance to dry etching using fluorocarbon or the like.

Method for Manufacturing Semiconductor Device

The method for manufacturing the semiconductor device according to the invention uses the fine pattern described above as an etching mask. A treatment is performed on the base material using the fine pattern described above as an etching mask. For example, the upper layer portion of the base material is selectively removed by performing dry etching by using the fine pattern as the etching mask. The semiconductor device can be obtained by repeating the treatment on the base material in this manner. The semiconductor device is, for example, a large scale integrated circuit (LSI).

EXAMPLES

With reference to the examples below, the invention is more specifically described. Materials, use amounts, ratios, treatment details, treatment sequences, and the like indicated in the examples below can be appropriately changed without departing from the gist of the invention. Accordingly, the scope of the invention is not limited to the specific examples below.

<Preparing of Curable Composition for Optical Imprinting>

In the ratio described below, the polymerizable compound (A), the photopolymerization initiator (B), and the compound (C) expressed by General Formula (I) are mixed, and 4-hydroxy-2,2,6,6-tetramethylpiperidine-1-oxyl free radical (manufactured by Tokyo Chemical Industry Co., Ltd.) was added to the curable composition in an amount of 200 ppm (0.02 mass %), as the polymerization inhibitor. This was filtrated with a filter made of PTFE of 0.1 µm, and curable compositions for optical imprinting X-1 to X-16 according to the invention and comparative curable compositions R-1 to R-5 were prepared. Further, Table 1 is presented in weight ratios. The viscosity and the surface tension of the prepared curable composition at 23° C. were measured by using an E-type viscometer RE85L (manufactured by Toki Sangyo Co., Ltd.) and a surface tension measuring device CBVP-A3 (manufactured by Kyowa Interface Science Co., LTD.). The results of the measured viscosity and surface tension are presented in the table.

Details of the polymerizable compound (A), the photopolymerization initiator (B), and the compound (C) expressed by General Formula (I) which were used in the examples and comparative examples are as below.

<Polymerizable Compound (A)>

A-1: Viscoat #192 (2-phenoxyethyl acrylate, manufactured by Osaka Organic Chemical Industry Ltd.)

A-2: Synthesized with 2-bromomethylnaphthalene and an acrylic acid

A-3: LIGHT ACRYLATE NP-A (neopentyl glycol diacrylate, manufactured by Kyoeisha Chemical Co., Ltd.)

A-4: Synthesized with α,α'-dichloro-m-xylene and an acrylic acid

A-5: R-1620 (2-(perfluorohexyl)ethyl acrylate, manufactured by Daikin Industries, Ltd.)

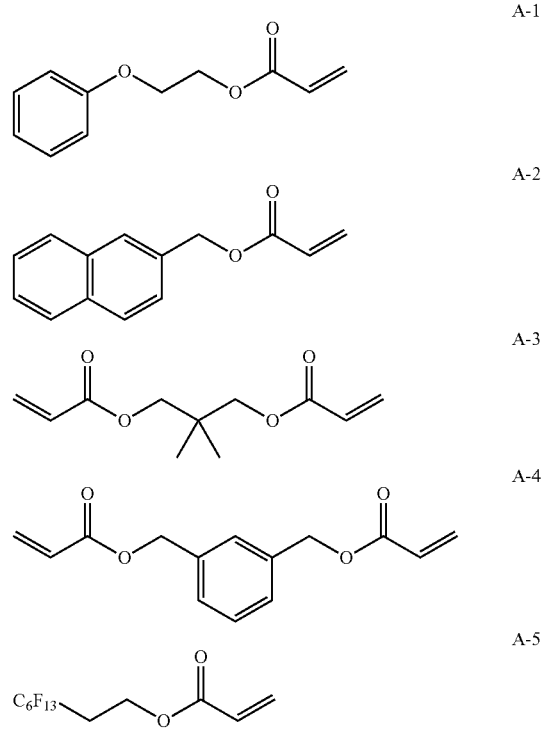

<Photopolymerization Initiator (B)>

B-2: LUCIRIN TPO (manufactured by BASF AG)

B-3: DAROCUR 1173 (manufactured by BASF AG)

B-4: IRGACURE OXE01 (manufactured by BASF AG)

<Compound (C) Expressed by General Formula (I)>

C-1: UNIOX MM-550 (manufactured by NOF Corporation)

The compounds (C-3), (C-4), (C-7), (C-8), (C-9), (C-10), (C-12), (C-14), and (C-16) expressed by General Formula (I) were synthesized in the method described below.

—Synthesizing of the Compound (C-3) Expressed by General Formula (I)—

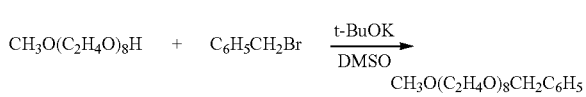

After 40.0 g of UNILUB M-400 (manufactured by NOF Corporation) and 100 mL of dimethyl sulfoxide were mixed, 12.3 g of potassium t-butoxide (manufactured by Wako Pure Chemical Industries, Ltd.) were dividedly added. Further, after 17.1 g of benzyl bromide (manufactured by Wako Pure Chemical Industries, Ltd.) was dripped, reaction was performed for 4 hours in room temperature. After 100 mL of water was added to the obtained reaction mixture, separating extraction was performed with 200 mL of chloroform. The desired compound (C-3) expressed by General Formula (I) was obtained by performing vacuum concentration on the organic layer.

—Synthesizing of the Compound (C-4) Expressed by General Formula (I)—

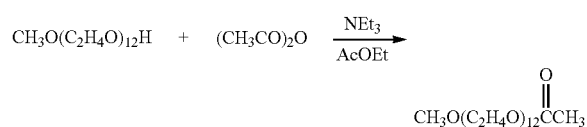

After 27.5 g of UNILUB M-550 (manufactured by NOF Corporation) and 100 mL of ethyl acetate were mixed, 5.6 g of acetic anhydride (manufactured by Wako Pure Chemical Industries, Ltd.) were added. Further, after 5.6 g triethylamine (manufactured by Wako Pure Chemical Industries, Ltd.) was added, reaction was performed for 4 hours in room temperature. After slightly excessive acetic anhydride was hydrolyzed by adding 100 mL of the saturated sodium bicarbonate aqueous solution to the obtained reaction mixture, the separating extraction was performed with 200 mL of chloroform. Subsequently, the organic layer was washed with 100 mL of a 0.1 M diluted aqueous hydrochloric acid solution and further with 100 mL of pure water. The desired compound (C-4) expressed by General Formula (I) was obtained by performing vacuum concentration on the organic layer.

—Synthesizing of the Compound (C-7) Expressed by General Formula (I)—

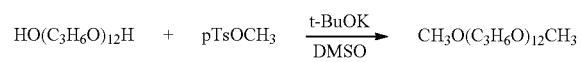

After 35.0 g of UNIOR D-700 (manufactured by NOF Corporation) and 200 mL of dimethyl sulfoxide were mixed, 12.3 g of potassium t-butoxide were dividedly added. Further, after 20.5 g of methyl p-toluenesulfonate (manufactured by Wako Pure Chemical Industries, Ltd.) was dripped, reaction was performed for 4 hours in room temperature. After slightly excessive methyl p-toluenesulfonate was hydrolyzed by adding 100 mL of a 1 M NaOH aqueous solution to the obtained reaction mixture, separating extraction was performed with 200 mL of ethyl acetate. Subsequently, the organic layer was washed with 100 mL of water. The desired compound (C-7) expressed by General Formula (I) was obtained by performing vacuum concentration on the organic layer.

—Synthesizing of Compound (C-8) Expressed by General Formula (I)—

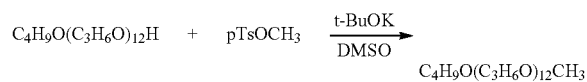

After 77 g of UNILUB MB-7 (manufactured by NOF Corporation) and 200 mL of dimethyl sulfoxide were mixed, 12.3 g of potassium t-butoxide were dividedly added. Further, after 20.5 g of methyl p-toluenesulfonate (manufactured by Wako Pure Chemical Industries, Ltd.) was dripped, reaction was performed for 4 hours in room temperature. After slightly excessive methyl p-toluenesulfonate was hydrolyzed by adding 100 mL of a 1 M NaOH aqueous solution to the obtained reaction mixture, separating extraction was performed with 200 mL of ethyl acetate. Subsequently, the organic layer was washed with 100 mL of water. The desired compound (C-8) expressed by General Formula (I) was obtained by performing vacuum concentration on the organic layer.

—Synthesizing of Compound (C-9) Expressed by General Formula (I)—

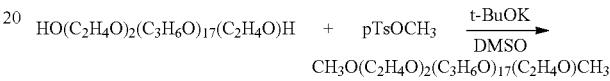

After 55 g of PLURONIC (manufactured by ADEKA Corporation) and 200 mL of dimethyl sulfoxide were mixed, 12.3 g of potassium t-butoxide were dividedly added. Further, after 20.5 g of methyl p-toluenesulfonate (manufactured by Wako Pure Chemical Industries, Ltd.) was dripped, reaction was performed for 4 hours in room temperature. After slightly excessive methyl p-toluenesulfonate was hydrolyzed by adding 100 mL of a 1 M NaOH aqueous solution to the obtained reaction mixture, separating extraction was performed with 200 mL of ethyl acetate. Subsequently, the organic layer was washed with 100 mL of water. The desired compound (C-9) expressed by General Formula (I) was obtained by performing vacuum concentration on the organic layer.

—Synthesizing of Compound (C-10) Expressed by General Formula (I)—

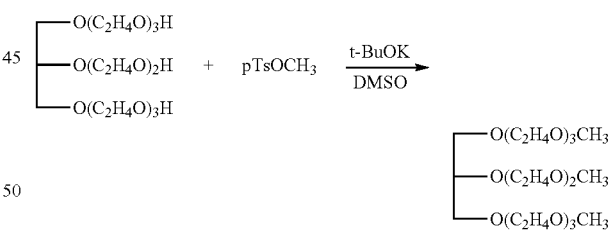

After 15.0 g of UNIOX G-450 (manufactured by NOF Corporation) and 200 mL of dimethyl sulfoxide were mixed, 12.3 g of potassium t-butoxide were dividedly added. Further, after 20.5 g of methyl p-toluenesulfonate (manufactured by Wako Pure Chemical Industries, Ltd.) was dripped, reaction was performed for 4 hours in room temperature. After slightly excessive methyl p-toluenesulfonate was hydrolyzed by adding 100 mL of a 1 M NaOH aqueous solution to the obtained reaction mixture, separating extraction was performed with 200 mL of chloroform. Subsequently, the organic layer was washed with 100 mL of water. The desired compound (C-10) expressed by General Formula (I) was obtained by performing vacuum concentration on the organic layer.

—Synthesizing of Compound (C-12) Expressed by General Formula (I)—

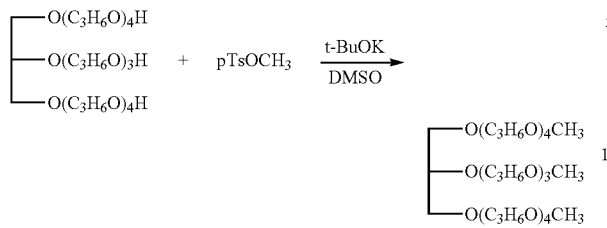

After 23.3 g of UNIOR TG-700 (manufactured by NOF Corporation) and 200 mL of dimethyl sulfoxide were mixed, 12.3 g of potassium t-butoxide were dividedly added. Further, after 20.5 g of methyl p-toluenesulfonate (manufactured by Wako Pure Chemical Industries, Ltd.) was dripped, reaction was performed for 4 hours in room temperature. After slightly excessive methyl p-toluenesulfonate was hydrolyzed by adding 100 mL of a 1 M NaOH aqueous solution to the obtained reaction mixture, separating extraction was performed with 200 mL of ethyl acetate. Subsequently, the organic layer was washed with 100 mL of water. The desired compound (C-12) expressed by General Formula (I) was obtained by performing vacuum concentration on the organic layer.

—Synthesizing of Compound (C-14) Compound (C-14) General Formula (I)—

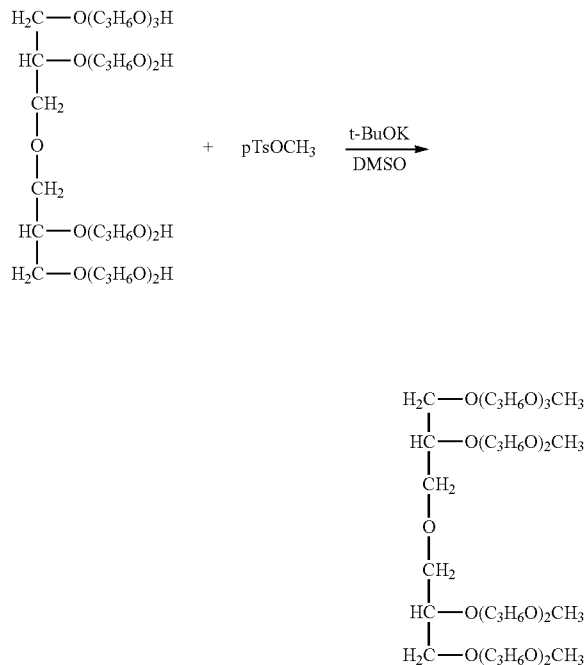

After 17.5 g of UNILUB DGP-700 (manufactured by NOF Corporation) and 200 mL of dimethyl sulfoxide were mixed, 12.3 g of potassium t-butoxide were dividedly added. Further, after 20.5 g of methyl p-toluenesulfonate (manufactured by Wako Pure Chemical Industries, Ltd.) was dripped, reaction was performed for 4 hours in room temperature. After slightly excessive methyl p-toluenesulfonate was hydrolyzed by adding 100 mL of a 1 M NaOH aqueous solution to the obtained reaction mixture, separating extraction was performed with 200 mL of ethyl acetate. Subsequently, the organic layer was washed with 100 mL of water. The desired compound (C-14) expressed by General Formula (I) was obtained by performing vacuum concentration on the organic layer.

—Synthesizing of Compound (C-16) Expressed by General Formula (I)—

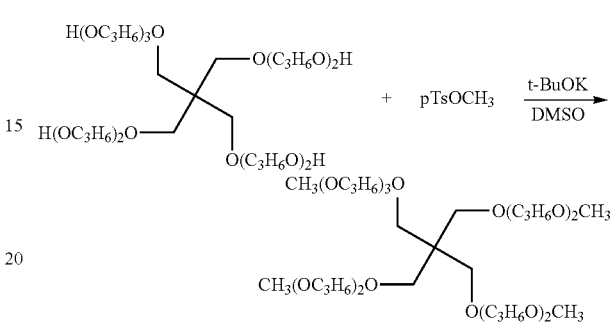

After 15.7 g of a pentaerythritol propylene oxide adduct (manufactured by Sigma-Aldrich Co. LLC.) and 200 mL of dimethyl sulfoxide were mixed, 12.3 g of potassium t-butoxide were dividedly added. Further, after 20.5 g of methyl p-toluenesulfonate (manufactured by Wako Pure Chemical Industries, Ltd.) was dripped, reaction was performed for 4 hours in room temperature. After slightly excessive methyl p-toluenesulfonate was hydrolyzed by adding 100 mL of a 1 M NaOH aqueous solution to the obtained reaction mixture, separating extraction was performed with 200 mL of ethyl acetate. Subsequently, the organic layer was washed with 100 mL of water. The desired compound (C-16) expressed by General Formula (I) was obtained by performing vacuum concentration on the organic layer.

<Comparative Compound (S)>

S-1: ZONYL FSO-100 (manufactured by DUPONT, S-1 has a general structure of $R^1R^2$, $R^1=F(CF_2CF_2)y-$ is satisfied, y is 1 to 7, $R^2=-CH_2CH_2O(CH_2CH_2O)xH$ is satisfied, and x is 0 to 15.)

S-2: Polyethylene glycol (manufactured by Wako Pure Chemical Industries, Ltd., Number average molecular weight: 600)

S-3: Polypropylene glycol (manufactured by Wako Pure Chemical Industries, Ltd., triol type, Number average molecular weight: 700)

S-4: Polyethylene glycol dimethyl ether 250 (manufactured by Kanto Kagaku, Number average molecular weight 250)

$$HO(C_2H_4O)_{13}H \quad (S-2)$$

(S-3)
$$\begin{array}{l} -O(C_3H_6O)_4H \\ -O(C_3H_6O)_3H \\ -O(C_3H_6O)_4H \end{array}$$

$$CH_3O(C_2H_4O)_5CH_3 \quad (S-4)$$

TABLE 1

| | X-1 | X-2 | X-3 | X-4 | X-5 | X-6 | X-7 | X-8 | X-9 | X-10 | X-11 | X-12 | X-13 | X-14 | X-15 | X-16 | R-1 | R-2 | R-3 | R-4 |
|---|---|---|---|---|---|---|---|---|---|---|---|---|---|---|---|---|---|---|---|---|
| A-1 | | | | | | | | | | | | | 44 | | | | | | | |
| A-2 | | | | | | | | | | | | | | 44 | | | | | | |
| A-3 | 22 | 22 | 22 | 22 | 22 | 22 | 22 | 22 | 22 | 22 | 22 | 22 | | | 22 | 22 | 22 | 22 | 22 | 22 |
| A-4 | 66 | 66 | 66 | 66 | 66 | 66 | 66 | 66 | 66 | 66 | 70 | 66 | 44 | 44 | 66 | 66 | 66 | 66 | 66 | 66 |
| A-5 | 2 | 2 | 2 | 2 | 2 | 2 | 2 | 2 | 2 | 2 | 2 | 2 | 2 | 2 | 2 | 2 | 2 | 2 | 2 | 2 |
| B-1 | 2 | 2 | 2 | 2 | 2 | 2 | 2 | 2 | 2 | 2 | 2 | 2 | 2 | 2 | | | 2 | 2 | 2 | 2 |
| B-2 | | | | | | | | | | | | | | | 2 | | | | | |
| B-3 | | | | | | | | | | | | | | | 2 | | | | | |
| B-4 | | | | | | | | | | | | | | | | 2 | | | | |
| C-1 | 8 | | | | | | | | | | | | | | | | | | | |
| C-3 | | 8 | | | | | | | | | | | | | | | | | | |
| C-4 | | | 8 | | | | | | | | | | | | | | | | | |
| C-7 | | | | 8 | | | | | | | | | | | | | | | | |
| C-8 | | | | | 8 | | | | | | | | | | | | | | | |
| C-9 | | | | | | 8 | | | | | | | | | | | | | | |
| C-10 | | | | | | | 8 | | | | | | | | | | | | | |
| C-12 | | | | | | | | | 8 | | 6 | 10 | 8 | 8 | 8 | 8 | | | | |
| C-14 | | | | | | | | | | 8 | | | | | | | | | | |
| C-16 | | | | | | | | | | | 8 | | | | | | | | | |
| S-1 | | | | | | | | | | | | | | | | | 8 | | | |
| S-2 | | | | | | | | | | | | | | | | | | 8 | | |
| S-3 | | | | | | | | | | | | | | | | | | | 8 | |
| S-4 | | | | | | | | | | | | | | | | | | | | 8 |
| Viscosity (mPa·s) | 11 | 10 | 11 | 10 | 10 | 12 | 10 | 10 | 12 | 10 | 10 | 11 | 11 | 12 | 10 | 10 | 10 | 13 | 15 | 10 |
| Surface tension (mN/m) | 31 | 31 | 31 | 31 | 31 | 31 | 31 | 31 | 31 | 31 | 31 | 31 | 31 | 31 | 31 | 31 | 12 | 31 | 31 | 31 |

<Preparing of Underlayer Film Composition>

After 3 g of NK OLIGO EA-7140/PGMAc (manufactured by Shin-Nakamura Chemical Co., Ltd.) was dissolved in 997 g of propylene glycol monomethyl ether acetate, filtration was performed with a tetrafluoroethylene filter of 0.1 μm, so as to obtain the underlayer film composition.

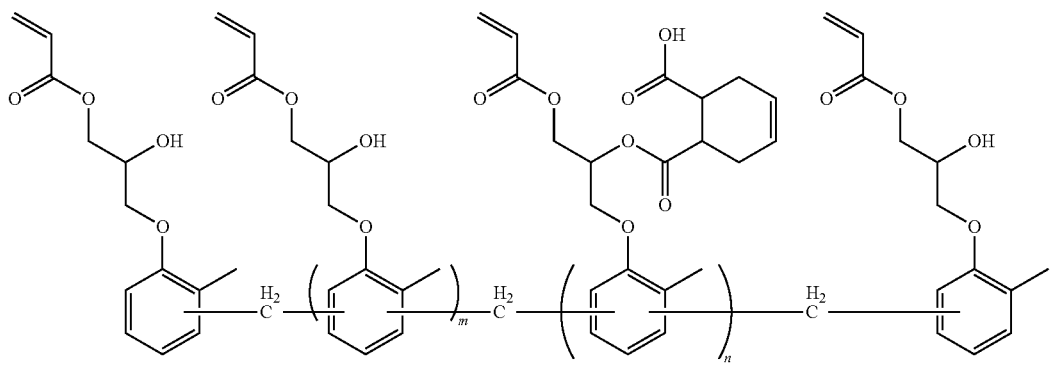

NK OLIGO EA-7140/PGMAc (Solid content 70%)

Average $m+n=4$, Average $n/(m+n)=0.5$ (Evaluation)

The obtained curable compositions for imprinting in the respective examples and comparative examples were evaluated as follows. The results are presented in the table below.

<Ink Jet (IJ) Ejection Position Precision>

A curable composition for optical imprinting of which the temperature was adjusted to 23° C. was ejected in a droplet amount of 1 pl per nozzle on a silicon wafer by using an ink jet printer DMP-2831 (manufactured by FUJIFILM Dimatix) and was applied such that the droplets form a square array with an interval of 100 μm on the silicon wafer.

2,500 dots in a 5 mm square of the applied substrate were observed, a gap from the square array was measured, and a standard deviation σ was calculated. The ink jet ejection position precision was evaluated to A to D as below.

A: $\sigma < 3$ μm

B: $3$ μm $\leq \sigma < 5$ μm

C: $5$ μm $\leq \sigma < 10$ μm

D: $10$ μm $\leq \sigma$

<Releasing Force Evaluation>

The underlayer film composition was spin-coated on the silicon wafer and heated for 1 minute on a hot plate of 100° C., such that the solvent was dried. Further, the underlayer film composition was cured by heating the underlayer film composition for 5 minutes on the hot plate of 220° C. so as to form an underlayer film. The film thickness of the underlayer film after curing was 3 nm.

The curable composition for optical imprinting of which the temperature was adjusted to 23° C. was ejected in a droplet amount of 1 pl per nozzle to the surface of the underlayer film on the silicon wafer by using an ink jet printer DMP-2831 (manufactured by FUJIFILM Dimatix)

and was applied such that the droplets form a square array with an interval of 100 μm on the underlayer film.

A quartz mold (line/space=1/1, line width: 30 nm, depth: 60 nm, line edge roughness: 3.0 nm) was brought into contact with the photosetting composition applied on the underlayer film under the reduced pressure of 0.1 atmospheric pressure and exposed to light from the quartz mold side in the condition of 100 mJ/cm² by using a high pressure mercury lamp. After the photoexposure, the quartz mold was released, and a releasing force (F) was measured at the point. The releasing force (F) was measured in conformity with the methods disclosed in paragraphs "0102" to "0107" of JP2011-206977A. The releasing force (F) was evaluated to S to E as below.

S: F<12N
A: 12N≤F<13N
B: 13N≤F<15N
C: 15N≤F<20N
D: 20N≤F<30N
E: 30N≤F

TABLE 2

| | Curable composition | Additive | IJ ejection precision | Releasing force |
|---|---|---|---|---|
| Example 1 | X-1 | C-1 | B | B |
| Example 2 | X-2 | C-3 | A | B |
| Example 3 | X-3 | C-4 | B | B |
| Example 4 | X-4 | C-7 | A | B |
| Example 5 | X-5 | C-8 | A | B |
| Example 6 | X-6 | C-9 | C | A |
| Example 7 | X-7 | C-10 | A | B |
| Example 8 | X-8 | C-12 | A | S |
| Example 9 | X-9 | C-14 | B | A |
| Example 10 | X-10 | C-16 | B | A |
| Example 11 | X-11 | C-12 | A | B |
| Example 12 | X-12 | C-12 | B | S |
| Example 13 | X-13 | C-12 | B | S |
| Example 14 | X-14 | C-12 | B | S |
| Example 15 | X-15 | C-12 | A | S |
| Example 16 | X-16 | C-12 | A | S |
| Comparative Example 1 | R-1 | S-1 | Not ejected | Not evaluated |
| Comparative Example 2 | R-2 | S-2 | C | B |
| Comparative Example 3 | R-3 | S-3 | D | B |
| Comparative Example 4 | R-4 | S-4 | A | D |

As clearly seen in the results in the table, the curable compositions for optical imprinting obtained in Examples 1 to 16 were evaluated to be excellent in ink jet ejection position precision and releasing force.

Meanwhile, the curable compositions for optical imprinting obtained in Comparative Examples 1 to 4 did not contain the compound expressed by General Formula (I), and thus evaluations thereof in ink jet ejection precision and releasing force were not satisfactory. In addition, in Comparative Example 1, since the surface tension was extremely low, the curable composition was not able to be ejected from the ink jet printer and the releasing force was not able to be evaluated.

In this manner, according to the invention, it was found that it is possible to provide a curable composition for optical imprinting excellent in ink jet adequacy and releasability by causing the curable composition for optical imprinting to contain the polymerizable compound (A), the photopolymerization initiator (B), and the compound expressed by General Formula (I) described above.

What is claimed is:

1. A curable composition for optical imprinting, comprising:
    a polymerizable compound (A);
    a photopolymerization initiator (B); and
    a compound (C) expressed by General Formula (I), General Formula (I)

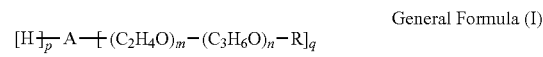

wherein, in General Formula (I), A represents a trihydric to hexahydric polyhydric alcohol residue, p represents 0 to 2, q represents 1 to 6, p+q represents an integer of 2 to 6, m represents an average number of addition of ethyleneoxide, n represents an average number of addition of propyleneoxide, each of m and n independently represents 0 to 20, r expressed by Formula (1) is 6 to 20;

$$r = (\text{sum of } m) + (\text{sum of } n) \quad (1)$$

and each R independently represents an alkyl group having 1 to 10 carbon atoms, an aryl group, an acetyl group, a propionyl group or a benzoyl group,
wherein, when each of m and n are 2 or greater, the distribution thereof is random or blocked.

2. The curable composition for optical imprinting according to claim 1,
wherein the content of the compound (C) expressed by General Formula (I) is 3 mass % to 15 mass % with respect to the total mass of the composition except for solvent.

3. The curable composition for optical imprinting according to claim 1,
wherein the viscosity of the curable composition for optical imprinting at 23° C. is 15 mPa·s or less, and the surface tension thereof is 25 mN/m to 35 mN/m.

4. The curable composition for optical imprinting according to claim 1,
wherein, in General Formula (I), R is an alkyl group having 1 to 4 carbon atoms.

5. The curable composition for optical imprinting according to claim 1,
wherein, in General Formula (I), p is 0.

6. The curable composition for optical imprinting according to claim 1,
wherein, in General Formula (I), m is 0.

7. The curable composition for optical imprinting according to claim 1,
wherein the polyhydric alcohol residue has 2 to 10 carbon atoms.

8. The curable composition for optical imprinting according to claim 1,
wherein, in General Formula (I), n is 0.

9. The curable composition for optical imprinting according to claim 1,
wherein the polymerizable compound (A) is a (meth)acrylate compound.

10. The curable composition for optical imprinting according to claim 1,
wherein the polymerizable compound (A) is a compound having an aromatic group.

11. The curable composition for optical imprinting according to claim 1,
wherein the content of a solvent is 5 mass % or less with respect to the total composition.

12. The curable composition for optical imprinting according to claim 1,
   wherein, in General Formula (I), p is 0, and the content of a solvent is 5 mass % or less with respect to the total composition.

13. The curable composition for optical imprinting according to claim 1,
   in General Formula (I), m is 0, and the content of a solvent is 5 mass % or less with respect to the total composition.

14. A pattern forming method, comprising:
   applying the curable composition for optical imprinting according to claim 1 on a base material or a mold having a fine pattern; and
   performing photoirradiation in a state in which the curable composition for optical imprinting is interposed between the mold and the base material.

15. The pattern forming method according to claim 14,
   wherein the method of applying the curable composition for optical imprinting on the base material or the mold having the fine pattern is an ink jet method.

16. A fine pattern obtained by the pattern forming method according to claim 14.

17. A method for manufacturing a semiconductor device using the pattern according to claim 16 as an etching mask.

* * * * *